US009679656B2

(12) United States Patent
Chang et al.

(10) Patent No.: US 9,679,656 B2
(45) Date of Patent: *Jun. 13, 2017

(54) METHOD, ELECTRONIC DEVICE AND CONTROLLER FOR RECOVERING ARRAY OF MEMORY CELLS

(71) Applicant: Macronix International Co., Ltd., Hsinchu (TW)

(72) Inventors: Kuen-Long Chang, Taipei (TW); Nai-Ping Kuo, Hsinchu (TW); Ken-Hui Chen, Hsin Chu (TW); Chao-Hsin Lin, Taichung (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/189,046

(22) Filed: Jun. 22, 2016

(65) Prior Publication Data

US 2016/0300616 A1 Oct. 13, 2016

Related U.S. Application Data

(63) Continuation of application No. 14/182,314, filed on Feb. 18, 2014, now Pat. No. 9,396,806.

(30) Foreign Application Priority Data

Nov. 20, 2013 (TW) ............................ 102142353 A

(51) Int. Cl.

| | |
|---|---|
| ***G11C 29/00*** | (2006.01) |
| ***G11C 16/10*** | (2006.01) |
| ***G11C 16/34*** | (2006.01) |
| ***G11C 16/26*** | (2006.01) |
| ***G11C 16/30*** | (2006.01) |

(52) U.S. Cl.

CPC ............. *G11C 16/10* (2013.01); *G11C 16/26* (2013.01); *G11C 16/30* (2013.01); *G11C 16/34* (2013.01); *G11C 16/3418* (2013.01)

(58) Field of Classification Search

None

See application file for complete search history.

(56) References Cited

U.S. PATENT DOCUMENTS

2008/0068912 A1 3/2008 Lee
2011/0032770 A1 2/2011 Wu et al.

(Continued)

FOREIGN PATENT DOCUMENTS

TW I370459 B1 8/2012

OTHER PUBLICATIONS

Office Action issued in corresponding Taiwan application on Jul. 29, 2015.

*Primary Examiner* — Daniel McMahon

(74) *Attorney, Agent, or Firm* — McClure, Qualey & Rodack, LLP

(57) ABSTRACT

A method, an electronic device and a controller for recovering an array of memory cells are provided. The method comprises the following steps. Whether a recovery control signal is received or not is determined. A retention checking procedure is executed for identifying whether a threshold voltage distribution of at least one bit of the memory cells in high threshold state is shifted or not, if the recovery control signal is received. A retention writing procedure is executed on the memory cells, if the memory cells in high threshold state do not pass the retention checking procedure.

13 Claims, 3 Drawing Sheets

(56) References Cited

U.S. PATENT DOCUMENTS

| | | | |
|---|---|---|---|
| 2012/0008394 | A1 | 1/2012 | Lee et al. |
| 2012/0099389 | A1 | 4/2012 | Park et al. |
| 2012/0262988 | A1 | 10/2012 | Kuo et al. |
| 2012/0287706 | A1 | 11/2012 | Lung |
| 2013/0046917 | A1 | 2/2013 | Yang et al. |
| 2014/0146624 | A1 | 5/2014 | Son et al. |
| 2014/0281768 | A1 | 9/2014 | Hung et al. |

METHOD, ELECTRONIC DEVICE AND CONTROLLER FOR RECOVERING ARRAY OF MEMORY CELLS

This is a continuation of application Ser. No. 14/182,314, filed Feb. 18, 2014 (now allowed) and entitled "METHOD, ELECTRONIC DEVICE AND CONTROLLER FOR RECOVERING ARRAY OF MEMORY CELLS", which claims the benefit of Taiwan patent application serial number 102142353, filed Nov. 20, 2013, the contents of which are incorporated by reference herein in its entirety.

BACKGROUND

Technical Field

The disclosure relates in general to a method, an electronic device and a controller, and more particularly to a method, an electronic device and a controller for recovering an array of memory cells.

Description of the Related Art

In flash memory devices, data is stored by trapping charge that establishes a cell threshold in memory cells. By sensing the cell threshold, data values can be read. However, as the memory cell sizes are reduced, charge retention, and therefore data retention, may suffer. In non-volatile memory devices configured to store data for a long period of time and through power-on/off events, data retention is an important performance factor.

It is desirable to provide technologies to improve non-volatile memory performance, and, in general, to improve data retention for integrated circuit memory.

SUMMARY

The disclosure is directed to a method, an electronic device and a controller for recovering an array of memory cells. A retention writing procedure can be executed by inputting a recovery control signal. Thus, the data values stored in memory cells can be kept for a long period of time.

According to a first aspect of the present disclosure, a method for recovering an array of memory cells is provided. The method comprises the following steps. Whether a recovery control signal is received or not is determined. A retention checking procedure is executed for identifying whether a threshold voltage distribution of at least one bit of the memory cells in high threshold state is shifted or not, if the recovery control signal is received. A retention writing procedure is executed on the memory cells, if the memory cells in high threshold state do not pass the retention checking procedure.

According to a second aspect of the present disclosure, an electronic device is provided. The electronic device includes an array of memory cells and a controller. The controller includes a retention checking circuit and a retention writing circuit. The retention checking circuit is for executing a retention checking procedure for identifying whether a threshold voltage distribution of at least one bit of the memory cells in high threshold state is shifted or not, if a recovery control signal is received. The retention writing circuit is for executing a retention writing procedure on the memory cells, if the memory cells in high threshold state do not pass the retention checking procedure.

According to a third aspect of the present disclosure, a controller is provided. The controller is configured to an electronic device comprising an array of memory cells. The controller includes a retention checking circuit and a retention writing circuit. The retention checking circuit is for executing a retention checking procedure for identifying whether a threshold voltage distribution of at least one bit of the memory cells in high threshold state is shifted or not, if a recovery control signal is received. The retention writing circuit is for executing a retention writing procedure on the memory cells, if the memory cells in high threshold state do not pass the retention checking procedure.

The above and other aspects of the disclosure will become better understood with regard to the following detailed description of the non-limiting embodiment(s). The following description is made with reference to the accompanying drawings.

DETAILED DESCRIPTION

Figure 1:
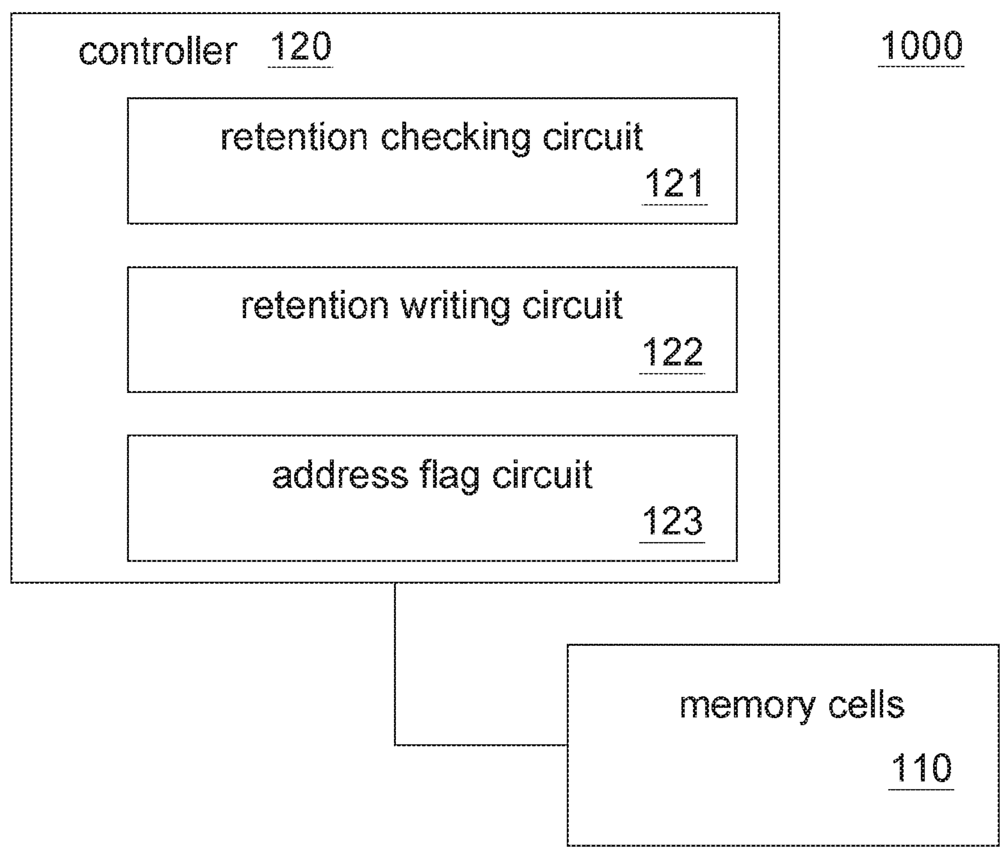
FIG. 1 shows an electronic device.

Preferred embodiments are disclosed below for elaborating the invention. A retention writing procedure can be executed by inputting a recovery control signal. Thus, the data values stored in memory cells can be kept for a long period of time. However, the following embodiments are for the purpose of elaboration only, not for limiting the scope of protection of the invention. Besides, secondary elements are omitted in the following embodiments to highlight the technical features of the invention.

References will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may tall within the spirit and scope of the invention as defined by the appended claims. It is to be understood and appreciated that the process steps and structures described herein do not cover a complete process flow for the operation of non-volatile memory devices. The present invention may be practiced in conjunction with various operating methods and other techniques that are conventionally used in the art, and only so much of the commonly practiced steps are included herein as are necessary to provide an understanding of the present invention. The present invention has applicability in the field of semiconductor devices and processes in general. For illustrative purposes, however, the following description pertains to a non-volatile memory device and a related method.

Please referring to FIG. 1, an electronic device 1000 is shown. The electronic device 1000 includes an array of memory cells 110 and a controller 120. The memory cells 110 are used for storing data values, such as "0" or "1." A computer can read those data values to execute a program or to perform an algorithm. For example, the memory cells 110 may be non-volatile memory cells.

The controller 120 is used for performing a plurality controlling procedures or a plurality of calculating procedures. For example, the controller 120 can be a chip, a circuit block in a chip, a circuit board including a plurality of electric elements and a plurality of conductive wires, or a computer readable medium storing a plurality of program codes. In the present embodiment, the controller 120 includes a retention checking circuit 121, a retention writing circuit 122 and an address flag circuit 123. The retention checking circuit 121 is used for executing a retention checking procedure. The retention writing circuit 122 is used for executing a retention writing procedure. The address flag circuit 123 is used for recording an address flag.

In one embodiment, the controller 120 and the array of memory cells 110 can be integrated into a semiconductor device. In one embodiment, the array of memory cells 110 may be a memory chip, and the controller 120 may be an apparatus comprising a hard disk storing a plurality of program codes.

Figure 2:
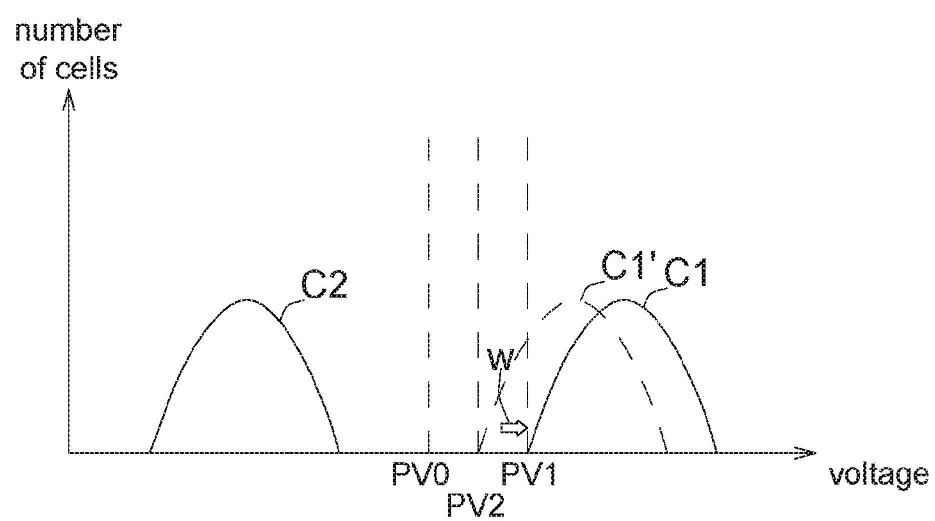
FIG. 2 shows a simplified diagram showing threshold voltage distributions of the memory cells.

Please referring to FIG. 2, FIG. 2 is a simplified diagram showing threshold voltage distributions of the memory cells 110. The vertical axis represents the number of cells having a particular threshold voltage (i.e. word line voltage at which the memory cell turns on sufficient for the sensing circuits), and the horizontal axis represents the word line voltage for the corresponding sample. The memory cells 110 are configured to store data values by using two threshold states including a high threshold state and a low threshold state. For memory cells 110, a high threshold distribution C1 corresponds to the memory cells 110 at the high threshold state, and a low threshold distribution C2 corresponds to the memory cells 110 at the low threshold state. In a read mode, the controller 120 applies a read voltage at a voltage level PV0 between the high threshold distribution C1 and the low threshold distribution C2. The range between the maximum threshold voltage of the low threshold distribution C2 and the minimum threshold voltage of the high threshold distribution C1 represents a margin for successful reading of the memory cells 110.

In the design of a floating gate and a charge trapping flash memory, as the technology progressively scales down in size, data retention may suffer because of charge leakage. Also, data retention can be an issue for other memory types. Data retention can suffer if the threshold voltages of the memory cells 110 drift during the life of the memory cells 110. This phenomenon is represented by the shifted high threshold distribution C1' shown in FIG. 2, where the memory cells 110 that use trapped charge to set the threshold voltage may lose charge over time. This shift in the threshold voltage reduces the margin, and may cause reliability problems.

As described herein, the controller 120 is provided to perform the retention checking procedure for the memory cells 110. The retention checking procedure includes applying a read voltage, such as at the voltage level PV1, to detect the memory cells 110 which are suffering a charge loss or another condition that leads to a reduction in their threshold voltage.

Then, the retention writing procedure represented by an arrow W can increase the threshold voltage of the memory cells 110. The retention writing procedure can be the same as a normal program sequence used in response to a program control signal. Alternatively, the retention writing procedure can be different from the normal program sequence. For example, the retention writing procedure may employ different voltages and/or different pulse widths than the normal program sequence. Also, the retention writing procedure may skip some steps used in normal program sequences. The use of different sequences for retention writing procedure can complicate the logic design, and so it may be preferred for some programming technologies, to use the same sequence for both.

Figure 3:
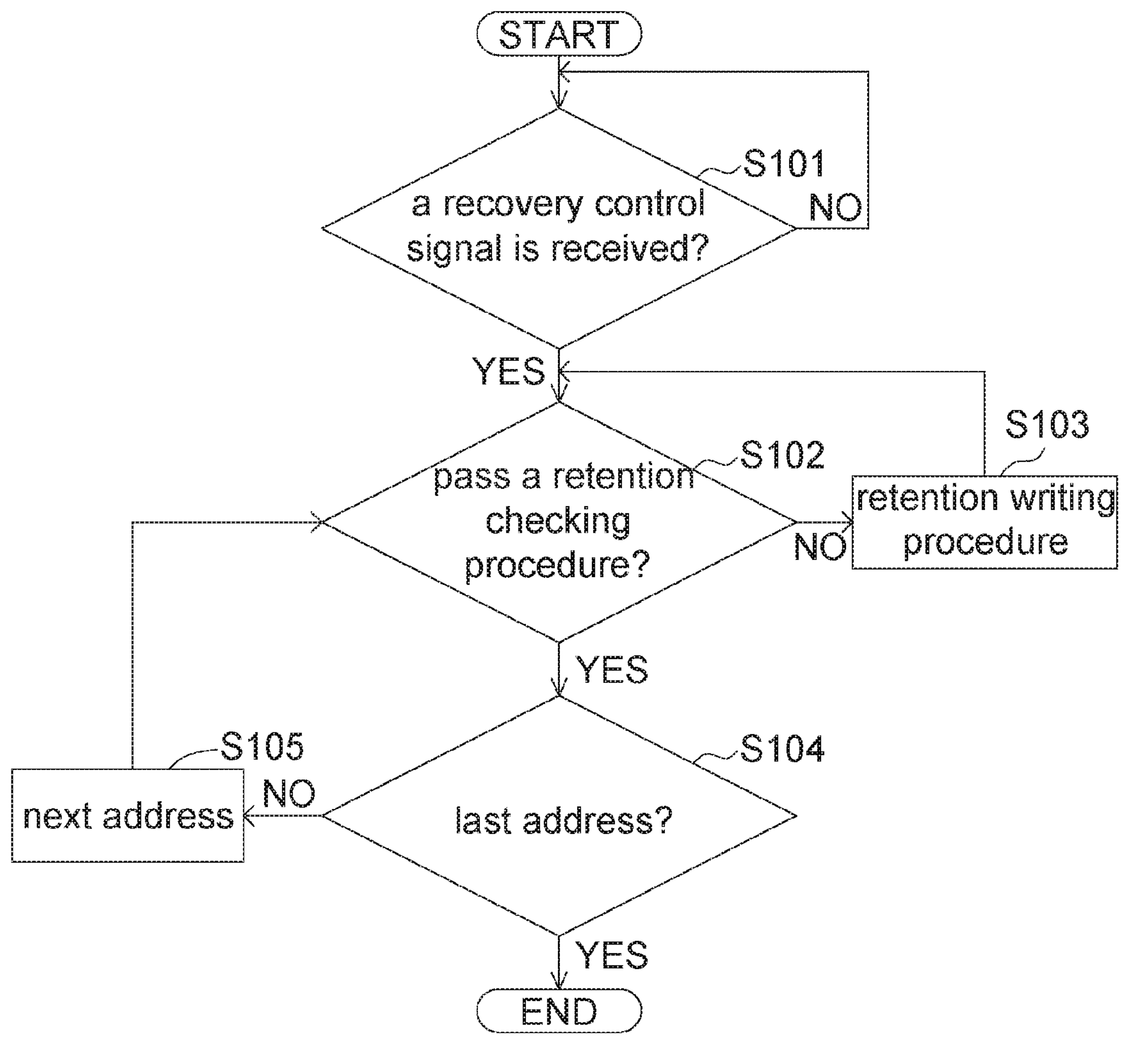
FIG. 3 shows a flowchart of a method for recovering an array of memory cells.

Please referring to FIG. 3, a flowchart of a method for recovering the array of memory cells 110 is shown. In step S101, the controller 120 determines whether a recovery control signal is received or not. If the recovery control signal is received. then the process proceeds to step S102; if the recovery control signal is not received, then the process goes back to the step S101. In this step S101, the recovery control signal is inputted by a user.

In step S102, the retention checking circuit 121 of the controller 120 executes the retention checking procedure for identifying whether a threshold voltage distribution of one bit, one byte, one word or one page of the memory cells 110 in the high threshold state is shifted or not. If the retention checking procedure is not passed, then the process proceeds to step S103; if the retention checking procedure is passed, then the process proceeds to step S104.

In one embodiment, the retention threshold checking procedure includes determining whether the threshold voltage distribution of the memory cells 110 in the high threshold state is within a predetermined range, such as the range from the voltages level PV1 to the voltage level PV2 shown in FIG. 2.

In step S103, the retention writing circuit 122 of the controller 120 executes the retention writing procedure on the memory cells 110. The retention writing procedure can shift the high threshold distribution C1 (shown in FIG. 2) to the high threshold distribution C1 (shown in FIG. 2).

In step S104, whether the identified memory cells 110 correspond a last address or not is determined. If the identified memory cells 110 correspond the last address, then the process is terminated; if the identified memory cells 110 do not correspond the last address, then the process proceeds to step S105. The address of the identified memory cells 110 is read from the address flag recorded by the address flag circuit 123.

In step S105, the address flag is pointed to a next address. Afterwards, the retention checking procedure in step S102 will be performed on the memory cells 110 corresponding to the next address.

Figure 4:
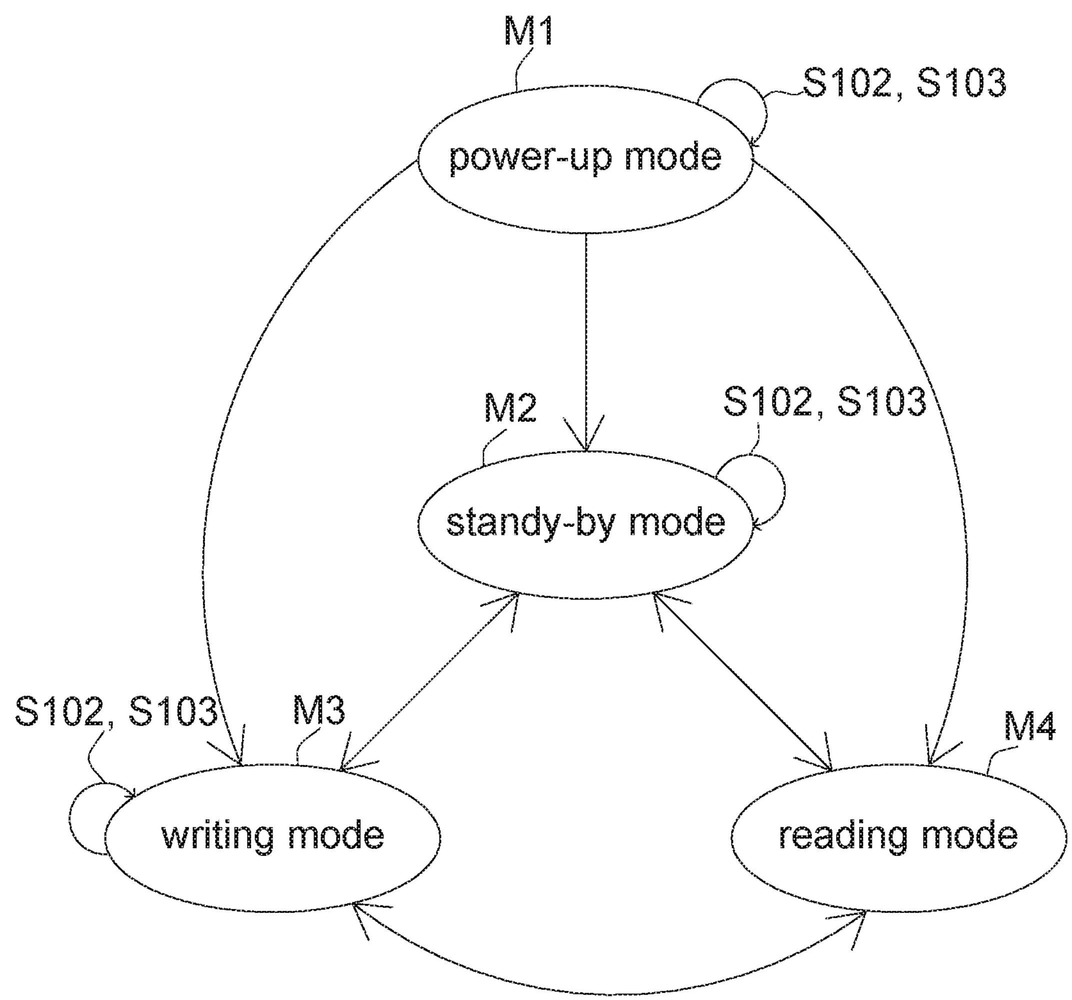
FIG. 4 shows typical modes for he memory cells.

Please referring to FIG. 4, typical modes for the memory cells 110 are shown. The memory cells 110 have a power-up mode M1, a stand-by mode M2, a writing mode M3 and a reading mode M4. In one embodiment, the retention checking procedure in step S102 and the retention writing procedure in step S103 can be performed during the power-up mode M1, the stand-by mode M2 or the writing mode M3.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for recovering a memory array including a plurality of memory cells, comprising:

executing a retention checking procedure for identifying whether a threshold voltage of one of the memory cells in a high threshold state is within a predetermined range; and executing a retention writing procedure on the one of the memory cells, when the threshold voltage of the one of the memory cells in the high threshold state is not within the predetermined range;

wherein the predetermined range is between a minimum threshold voltage of a shifted threshold voltage distribution of at least one bit of the memory cells in the high threshold state and a minimum threshold voltage of the threshold voltage distribution of at least one bit of the memory cells in the high threshold state.

2. The method according to claim 1, wherein the step of executing the retention checking procedure includes applying a read voltage to detect the threshold voltage of the one of the memory cells.

3. The method according to claim 1, wherein the step of executing the retention writing procedure includes increasing the threshold voltage of the one of the memory cells in the high threshold state.

4. The method according to claim 1, wherein the step of executing the retention checking procedure and the step of executing the retention writing procedure are performed during a power-up mode, a stand-by mode or a writing mode.

5. An electronic device, comprising:

a memory array including a plurality of memory cells; and a controller, including:

a retention checking circuit, for executing a retention checking procedure for identifying whether a threshold voltage distribution of one of the memory cells in a high threshold state is within a predetermined range; and a retention writing circuit, for executing a retention writing procedure on the one of the memory cells when the threshold voltage of the one of the memory cells in the high threshold state is not within the predetermined range;

wherein the predetermined range is between a minimum threshold voltage of a shifted threshold voltage distribution of at least one bit of the memory cells in the high threshold state and a minimum threshold voltage of the threshold voltage distribution of at least one bit of the memory cells in the high threshold state.

6. The electronic device according to claim 5, wherein the retention checking circuit applies a read voltage to detect the threshold voltage of the one of the memory cells.

7. The electronic device according to claim 5, wherein the controller further includes:

an address flag circuit, for determining whether some of the memory cells in the high threshold state which pass the retention checking procedure correspond a last address, and for proceeding to a next address, if the some of the memory cells in the high threshold state which pass the retention checking procedure do not correspond the last address.

8. The electronic device according to claim 5, wherein the retention writing circuit increases the threshold voltage of the one of the memory cells in the high threshold state.

9. The electronic device according to claim 6, wherein the retention checking circuit performs the retention checking procedure and the retention writing circuit performs the retention writing procedure during a power-up mode, a stand-by mode or a writing mode.

10. A controller, configured to an electronic device comprising a memory array including a plurality of memory cells, wherein the controller comprises:

a retention checking circuit, for executing a retention checking procedure for identifying whether a threshold voltage of one of the memory cells in a high threshold state is within a predetermined range; and a retention writing circuit, for executing a retention writing procedure on the one of the memory cells when the threshold voltage of the one of the memory cells in the high threshold state is not within the predetermined range;

wherein the predetermined range is between a minimum threshold voltage of a shifted threshold voltage distribution of at least one bit of the memory cells in the high threshold state and a minimum threshold voltage of the threshold voltage distribution of at least one bit of the memory cells in the high threshold state.

11. The controller according to claim 10, further comprising:

an address flag circuit, for determining whether some of the memory cells in the high threshold state which pass the retention checking procedure correspond a last address, and for proceeding to a next address, if the some of the memory cells in the high threshold state which pass the retention checking procedure do not correspond the last address.

12. The controller according to claim 10, wherein the retention writing circuit increases the threshold voltage of the one of the memory cells in the high threshold state.

13. The controller according to claim 11, wherein the retention checking circuit performs the retention checking procedure and the retention writing circuit performs the retention writing procedure during a power-up mode, a stand-by mode or a writing mode.

* * * * *